(12) United States Patent
Sato et al.

(10) Patent No.: US 8,833,298 B2
(45) Date of Patent: Sep. 16, 2014

(54) FILM FORMING APPARATUS

(75) Inventors: Izumi Sato, Oshu (JP); Isao Shiratani, Oshu (JP); Satoshi Asari, Oshu (JP); Tsuyoshi Murakami, Oshu (JP)

(73) Assignee: Tokyo Electron Limited (JP)

( * ) Notice: Subject to any disclaimer, the term of this patent is extended or adjusted under 35 U.S.C. 154(b) by 1 day.

(21) Appl. No.: 13/537,597

(22) Filed: Jun. 29, 2012

(65) Prior Publication Data

US 2013/0167772 A1  Jul. 4, 2013

(30) Foreign Application Priority Data

Jun. 30, 2011 (JP) .................................. 2011-146244

(51) Int. Cl.
*C23C 16/44* (2006.01)
*C23C 16/00* (2006.01)
*B05C 11/00* (2006.01)

(52) U.S. Cl.
CPC ................. *C23C 16/44* (2013.01); *C23C 16/00* (2013.01); *B05C 11/00* (2013.01)
USPC ............ 118/712; 118/728; 118/733; 118/715

(58) Field of Classification Search
None
See application file for complete search history.

(56) References Cited

U.S. PATENT DOCUMENTS

| 2004/0194707 A1* | 10/2004 | Takahashi et al. ............ 118/722 |
| 2008/0286981 A1* | 11/2008 | Hasper .......................... 438/762 |
| 2009/0035946 A1* | 2/2009 | Pierreux et al. ............... 438/763 |
| 2011/0303152 A1* | 12/2011 | Asari et al. .................... 118/725 |
| 2011/0306212 A1* | 12/2011 | Sato et al. ..................... 438/706 |
| 2012/0216743 A1* | 8/2012 | Itoh et al. ........................ 117/88 |

FOREIGN PATENT DOCUMENTS

JP              2002270593     *  9/2002    ............. H01L 21/31

\* cited by examiner

*Primary Examiner* — Dah-Wei D Yuan
*Assistant Examiner* — Jethro Pence
(74) *Attorney, Agent, or Firm* — Cantor Colburn LLP

(57) ABSTRACT

A film forming apparatus includes a substrate holding unit holding substrates at intervals; a reaction chamber accommodating the substrate holding unit; a raw material gas supply pipe supplying a raw material gas of a thin film to the substrate; a support unit supporting the reaction chamber; a heating unit being disposed outside the reaction chamber and heating the substrates; a protection pipe including one end portion fixed to the support unit, being extended along an arrangement direction of the substrates between the substrate holding unit and the reaction chamber, and including a temperature measuring unit inserted therein; and a protrusion portion being provided on at least one of an outer surface of the protection pipe and an inner surface of the reaction chamber, and providing a gap between the outer surface of the protection pipe and the inner surface of the reaction chamber.

6 Claims, 9 Drawing Sheets

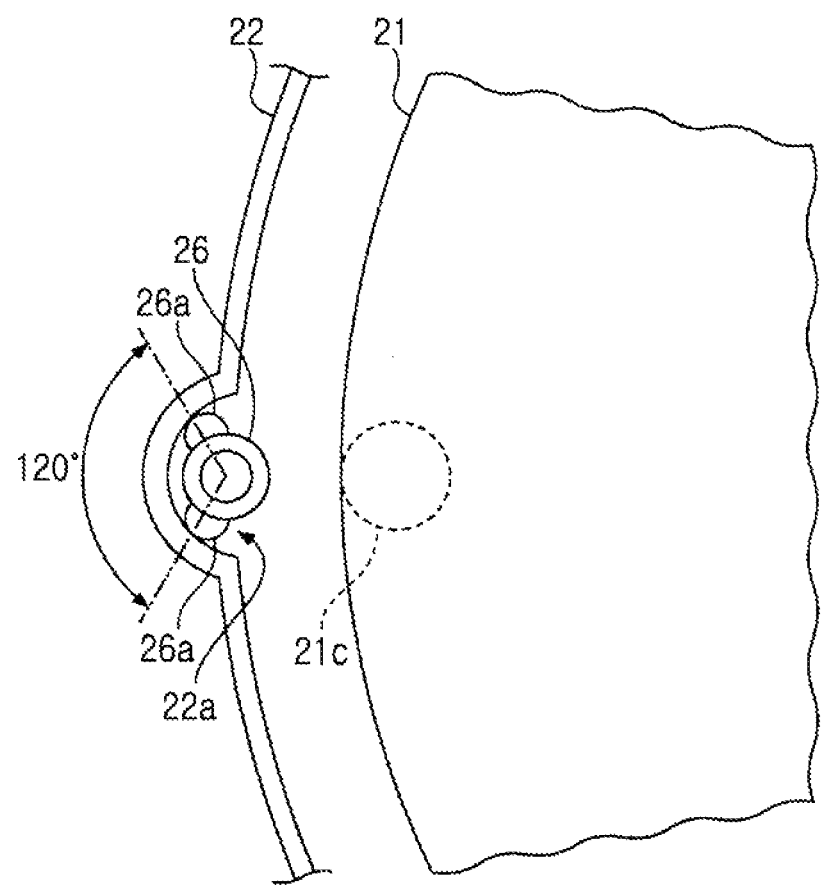

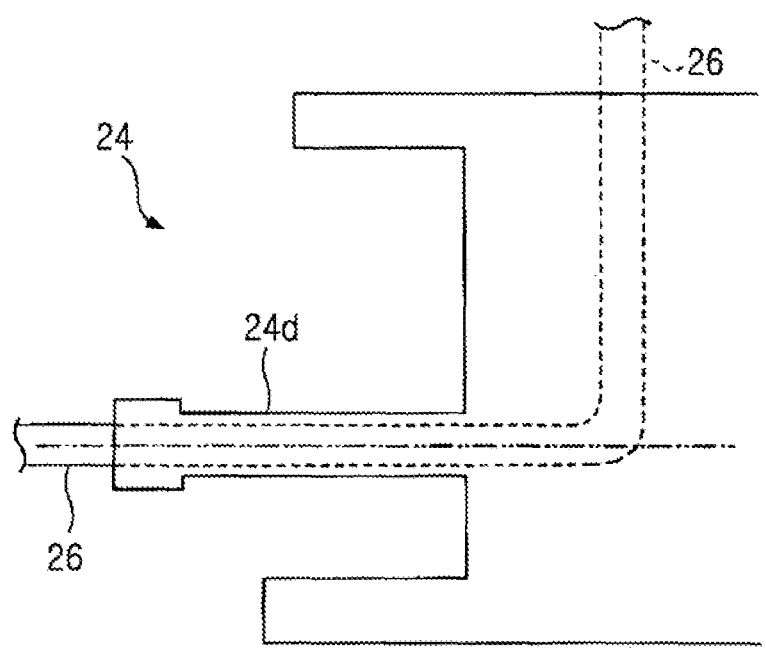

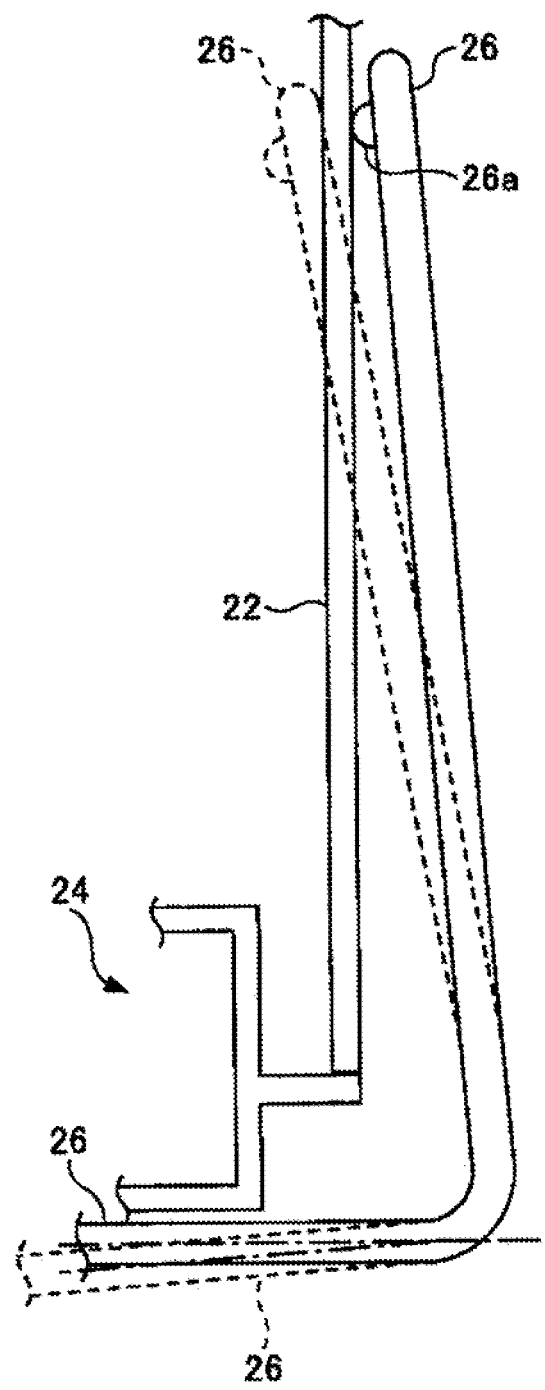

FILM FORMING APPARATUS

CROSS-REFERENCE TO RELATED PATENT APPLICATIONS

This application claims the benefit of Japanese Patent Application No. 2011-146244, filed on Jun. 30, 2011, in the Japan Patent Office, the disclosure of which is incorporated herein in its entirety by reference.

BACKGROUND OF THE INVENTION

1. Field of the Invention

The present invention relates to a film forming apparatus for forming a thin film on a substrate.

2. Description of the Related Art

A manufacturing process of a semiconductor integrated circuit includes various film forming processes for forming several thin films on a substrate, such as a semiconductor wafer (hereinafter, referred to as a wafer). A so-called batch-type film forming apparatus may be used during a film forming process. Such a film forming apparatus includes a wafer boat holding a plurality of wafers at intervals, a reaction chamber accommodating the wafer boat, a support unit supporting the reaction chamber, a raw material gas supply pipe extended along the wafer boat inside the reaction chamber and for supplying a raw material gas for forming a thin film on the wafers to the wafers, and a heater disposed outside the reaction chamber and for heating the wafers held by the wafer boat.

Also, in the film forming apparatus, a temperature measuring unit is provided along the wafer boat so as to measure a temperature of the wafers. In order to protect the temperature measuring unit from the raw material gas, the temperature measuring unit may be inserted into a protection pipe extended along the wafer boat (for example, Patent Reference 1).

In the film forming apparatus, when a thin film is formed on the wafers, for example, the wafers are loaded on the wafer boat, the wafer boat is accommodated in the reaction chamber, the wafers held by the wafer boat are heated by using the heater so that a temperature of the wafers reaches a predetermined film forming temperature, and then the raw material gas is supplied. Accordingly, the raw material gas is decomposed by heat of the wafers, and a thin film is formed on the wafers by a decomposition product.

Here, the decomposition product is not only deposited on the wafers, but also on the wafer boat, the reaction chamber, and the protection pipe. Thus, if an outer surface of the protection pipe contacts an inner surface of the reaction chamber, the outer surface of the protection pipe may be adhered to the inner surface of the reaction chamber due to the decomposition product. In this case, it is not easy to separate the protection pipe from the inner surface of the reaction chamber during maintenance of the film forming apparatus, and the protection pipe may be damaged if the protection pipe is separated by force. Accordingly, careful work is required, and thus a time required for maintenance may be increased.

Also, if the outer surface of the protection pipe is adhered to the inner surface of the reaction chamber, a stress may be applied to the protection pipe while decreasing the temperature of the wafers after film formation, thereby damaging the protection pipe.

3. Prior Art Reference (Patent Reference 1) Japanese Laid-Open Patent Publication No. 2002-270593

SUMMARY OF THE INVENTION

The present invention provides a film forming apparatus capable of preventing an outer surface of a protection pipe from being adhered to an inner surface of a reaction chamber.

According to an aspect of the present invention, there is provided a film forming apparatus including: a substrate holding unit which holds a plurality of substrates such that the plurality of substrates are stacked on each other at intervals; a reaction chamber which accommodates the substrate holding unit; a raw material gas supply pipe which supplies a raw material gas of a thin film formed on the plurality of substrates to the plurality of substrate held by the substrate holding unit accommodated in the reaction chamber; a support unit which supports the reaction chamber; a heating unit which is disposed outside the reaction chamber and heats the plurality of substrates; a protection pipe which includes one end portion fixed to the support unit, is extended along an arrangement direction of the plurality of substrates between the substrate holding unit and the reaction chamber, and includes a temperature measuring unit inserted therein; and a protrusion portion which is provided on at least one of an outer surface of the protection pipe and an inner surface of the reaction chamber, and provides a gap between the outer surface of the protection pipe and the inner surface of the reaction chamber.

Additional objects and advantages of the invention will be set forth in the to description which follows, and in part will be obvious from the description, or may be learned by practice of the invention.

The objects and advantages of the invention may be realized and obtained by means of the instrumentalities and combinations particularly pointed out hereinafter.

BRIEF DESCRIPTION OF THE DRAWINGS

The accompanying drawings, which are incorporated in and constitute a part of the specification, illustrate embodiments of the invention, and together with the general description given above and the detailed description of the embodiments given below, serve to explain the principles of the invention.

FIG. 2 is a schematic top view showing a location relationship between a protection pipe and a reaction chamber of the film forming apparatus of FIG. 1;

FIGS. 3A and 3B are views for explaining a reason for a stress applied to the protection pipe in the film forming apparatus of FIG. 1;

FIGS. 5A and 5B are respectively a view and a graph for explaining an effect by a protrusion portion provided at a leading end portion of the protection pipe of the film forming apparatus of FIG. 1.

DETAILED DESCRIPTION OF THE INVENTION

Figure 1:
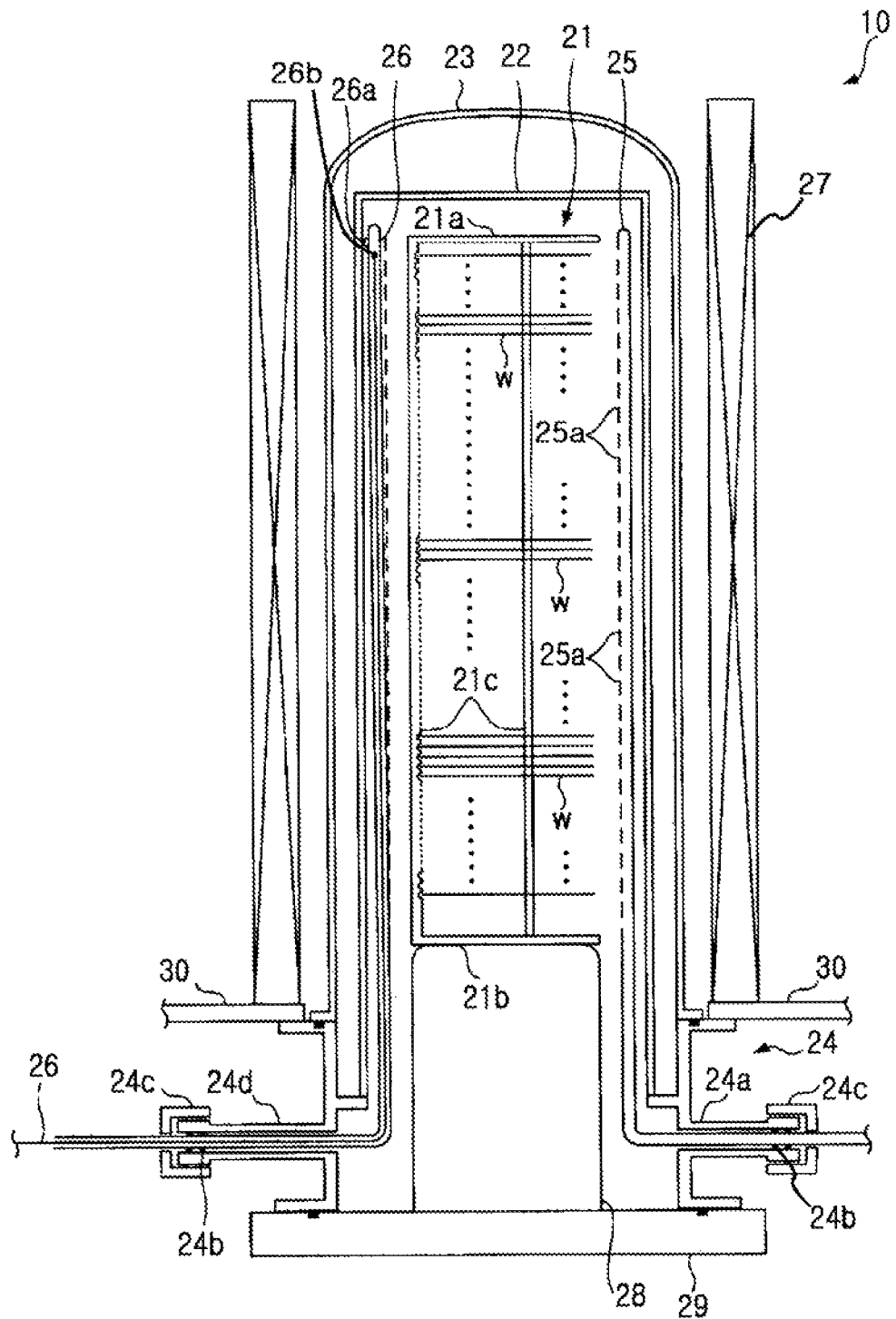
FIG. 1 is a schematic cross-sectional view showing a film forming apparatus according to an embodiment of the present invention.

An embodiment of the present invention achieved on the basis of the findings given above will now be described with reference to the accompanying drawings. In the following description, the constituent elements having substantially the same function and arrangement are denoted by the same reference numerals, and a repetitive description will be made only when necessary.

Hereinafter, not-limited exemplary embodiments of the present invention are described with reference to attached drawings. Throughout the drawings, like reference numerals denote like elements, and thus overlapping details thereof shall not be repeated. Also, the drawings are not intended to show relative ratios between elements or parts, and thus detailed measurements are determined by one of ordinary skill in the art based on the following not-limited embodiments.

FIG. 1 is a schematic cross-sectional view showing a film forming apparatus 10 according to an embodiment of the present invention. As shown in FIG. 1, the film forming apparatus 10 includes a wafer boat 21 which holds a plurality of wafers W such that the plurality of wafers W are stacked on each other at intervals in an up-and-down direction, a reaction chamber 22 which accommodates the wafer boat 21, an outer chamber 23 which accommodates the reaction chamber 22, and a manifold 24 which supports the reaction chamber 22 and the outer chamber 23. Also, a raw material gas nozzle 25 which supplies a raw material gas to the wafers W held by the wafer boat 21 and a protection pipe 26 into which a temperature measuring unit, for example, a thermocouple or a thermoresistor, is inserted to protect the temperature measuring unit from the raw material gas or the like, are provided at the film forming apparatus 10. The raw material gas nozzle 25 and the protection pipe 26 are extended along the wafer boat 21 in a space between the wafer boat 21 and the reaction chamber 22, and are disposed across the wafer boat 21 from each other.

Also, a heater 27 which is disposed to surround an outer circumference of the outer chamber 23 and heats the wafers W held by the wafer boat 21 is provided at the film forming apparatus 10. The heater 27 may include a plurality of partition heaters disposed in an up-and-down direction, and a power supply device (not shown) is connected to each partition heater. Also, an additional heater (not shown) which heats the wafers W from a top of the outer chamber 23 may be provided at the top of the outer chamber 23.

The wafer boat 21 is formed of, for example, quartz glass, and includes a top lid portion 21a, a bottom lid portion 21b, and, for example, three supports 21c (only two are shown in FIG. 1) which support the top lid portion 21a to the bottom lid portion 21b. A plurality of slits are provided on the supports 21c. Each of the plurality of slits is provided so as to be located at the same height as a corresponding slit of each support 21c, and thus the wafers W are supported by such slits. A number and interval of the slits may be determined according to a size of the wafers W, a number of the wafers W to be processed via one film forming process, or a size of the reaction chamber 22.

Also, a bottom of the wafer boat 21 is supported by a pedestal 28, and the pedestal 28 is fixed on an elevation plate 29. The elevation plate 29 may be moved up and down by an elevation mechanism (not shown). During film formation, the elevation plate 29 is moved up by the elevation mechanism, and contacts a bottom surface of the manifold 24 via a seal member, for example, an O-ring or a metal seal. Accordingly, a space (hereinafter, referred to as an inner space) defined by the outer chamber 23, the manifold 24, and the elevation plate 29, and an outer space are isolated. Also, when the wafer beat 21 is unloaded from the reaction chamber 22, the elevation plate 29, and furthermore the wafer boat 21, are moved down by the elevation mechanism.

The reaction chamber 22 is formed of, for example, quartz glass having a cylindrical shape including a lid, and a bottom portion of the reaction chamber 22 is supported by a flange portion provided at an inner circumference of the manifold 24. The outer chamber 23 surrounding an outer side of the reaction chamber 22 is formed of, for example, quartz glass having a cylindrical shape including a lid. Also, the outer chamber 23 is hermetically adhered to a top surface of the manifold 24 via a seal member, for example, an O-ring or a metal seal.

Also, one or at least two openings (not shown) are provided at the reaction chamber 22, and thus an inner space of the reaction chamber 22 and an outer space of the reaction chamber 22 (an inner space of the outer chamber 23) communicate with each other through the opening. Furthermore, an exhaust pipe (not shown) is connected to the manifold 24, and the exhaust pipe is connected to an exhaust apparatus including a vacuum pump. Accordingly, the raw material gas supplied from the raw material gas nozzle 25 to the wafers W described below is exhausted through the openings of the reaction chamber 22 and the exhaust pipe of the outer chamber 23. Also, a pressure controller (not shown) is provided at the exhaust pipe, and thus a pressure inside the reaction chamber 22 is adjusted.

An upper flange of the manifold 24 is attached to a base unit 30 by a plurality of bolts and nuts (not shown). Accordingly, the manifold 24 supports the reaction chamber 22 and the outer chamber 23 to the base unit 30.

The raw material gas nozzle 25 is formed of, for example, quartz glass, reaches the inner space through a nozzle introduction portion 24a provided at the manifold 24, and is extended along the wafer boat 21 by bending upward. A seal member 24b, for example, an O-ring, and a connector 24c which maintains airtightness by pushing the seal member toward the raw material gas nozzle 25, are provided at an end portion of the nozzle introduction portion 24a. Also, an end portion of the raw material gas nozzle 25 outside the manifold 24 is connected to a raw material supply system (not shown), and the raw material gas is supplied to the raw material gas nozzle 25 from the raw material supply system. Also, a plurality of openings 25a which are opened toward the wafers W held by the wafer boat 21 are provided at the raw material gas nozzle 25, and the raw material gas supplied from the raw material supply system is supplied to the wafers W through the openings 25a.

In addition, the raw material supply system includes a gas cylinder (not shown) in which the raw material gas corresponding to a thin film to be formed on the wafers W is stored, and a pressure controller (for example, a regulator) or a flow rate adjustor (for example, a mass flow controller) (both not shown) is provided at a pipe connecting the gas cylinder and the raw material gas nozzle 25, and thus the raw material gas is supplied to the raw material gas nozzle 25 while its flow rate is being controlled.

The protection pipe 26 is formed of, for example, quartz glass, reaches the inner space through a protection pipe introduction portion 24d provided at the manifold 24, and is extended along the wafer boat 21 by bending upward. The seal member 24b and the connector 24c are also provided at the protection pipe introduction portion 24d, and thus airtightness is maintained. A plurality of thermocouples 26b (only one is shown in FIG. 1), for example, are inserted into the protection pipe 26. Temperature measuring ends of each thermocouple 26b are disposed at different locations in a height direction, and thus a temperature distribution of the wafer boat 21 in a length direction may be obtained. A temperature adjustor (not shown) is connected to the thermocouples 26b. Each power supply device of the partition heaters described above is controlled based on temperature measurement results of the thermocouples 26b, and thus the plurality of wafers W held by the wafer boat 21 may be uniformly heated.

FIG. 2 is a schematic partial top view of the film forming apparatus 10, wherein a location relationship between the wafer boat 21, the reaction chamber 22, and the protection pipe 26 is shown. As shown in FIG. 2, a groove portion 22a sunken to the wafer boat 21 is provided on the reaction chamber 22. In the present embodiment, the groove portion 22a is extended from a bottom to a top of the reaction chamber 22. Since an inner surface of the reaction chamber 22 is outwardly sunken by the groove portion 22a, a space for disposing the protection pipe 26 may be increased. In other words, the providing of the groove portion 22a on the reaction chamber 22 is effective when the space between the reaction chamber 22 and the wafer boat 21 is narrow. Also, when the space between the reaction chamber 22 and the wafer boat 21 is narrowed by providing the groove portion 22a, the raw material gas supplied from the raw material gas nozzle 25 may easily flow into a space between the wafers W, and thus film forming efficiency is improved.

Furthermore, two protrusion portions 26a are provided near a top of the protection pipe 26 (refer to FIG. 1). In the present embodiment, the protrusion portions 26a are disposed at an interval of about 120° around the protection pipe 26. A shape of the protrusion portions 26a is not limited to a hemispherical shape shown in FIG. 2, and may be a column shape (a cylindrical shape or a horn shape) or a pin shape. Also, to minimize a contact area between the protrusion portions 26a and the inner surface of the reaction chamber 22, if the protrusion portions 26a have a column shape, leading end portions may be round. Also, a size of the protrusion portions 26a may be determined based on a depth or width of the groove portion 22a, an outer diameter of the protection pipe 26, an interval between the reaction chamber 22 and the wafer boat 21, or the like. In the present embodiment, a height of the protrusion portions 26a (a protruded amount from an outer surface of the protection pipe 26) is about 4 mm.

Also, in the present embodiment, since the leading end portions of the two protrusion portions 26a contact an inner surface of the groove portion 22a, and the interval angle of the two protrusion portions 26a is about 120°, a location misalignment of the protection pipe 26 in a direction along the inner surface of the reaction chamber 22 may be effectively prevented.

When a thin film is formed on the wafers W by using the film forming apparatus 10, first, the wafers W are loaded from a wafer carrier to the wafer boat 21 unloaded from the reaction chamber 22 by using a wafer transfer mechanism (not shown) provided together with the film forming apparatus 10. Next, the wafer boat 21 is loaded into the reaction chamber 22, and the inner space (the space defined by the outer chamber 23, the manifold 24, and the elevation plate 29) is evacuated to a predetermined pressure while the inner space is purged as, for example, an inert gas is supplied from a purge gas supply nozzle (not shown). The wafers W are then heated up to a predetermined film forming temperature (for example, 500° C. to 600° C.) by using the heater 27, disilane ($Si_2H_6$), for example, is supplied from the raw material gas nozzle 25, disilane is thermally decomposed by heat of the wafers W, and thus an amorphous silicon thin film is formed on the wafers W. After the amorphous silicon thin film having a predetermined film thickness is formed, the supplying of disilane is stopped, the heating of the wafers W is stopped, the inner space is purged by the inert gas, and then the wafer boat 21 is unloaded from the reaction chamber 22. Then, the wafers W are carried from the wafer boat 21 to, for example, the wafer carrier by using the transfer mechanism, thereby ending a film forming process.

In the above film forming process, since a thin film is formed on the outer surface of the protection pipe 26 or the inner surface of the reaction chamber 22 when the outer surface of the protection pipe 26 contacts the inner surface of the reaction chamber 22 during the film formation, the outer surface of the protection pipe 26 may be adhered to the inner surface of the reaction chamber 22 due to the thin film. In this case, it has been determined through examinations of the present inventors that a relatively large stress is applied to the protection pipe 26 when the temperature of the wafers W is decreased. Here, a reason for the stress examined by the present inventors is described with reference to FIGS. 3A and 3B.

FIG. 3A is a view showing the manifold 24, the protection pipe introduction portion 24d, and the protection pipe 26 when the outer chamber 23, the reaction chamber 22, and the wafer boat 21 are at room temperature after installing or maintaining the film forming apparatus 10. As shown in FIG. 3A, the protection pipe introduction portion 24d is extended from the manifold 24 almost horizontally, and thus the protection pipe 26 is horizontally inserted into the manifold 24. Also, the protection pipe 26 is bent upward in the inner space.

Figure 3B:
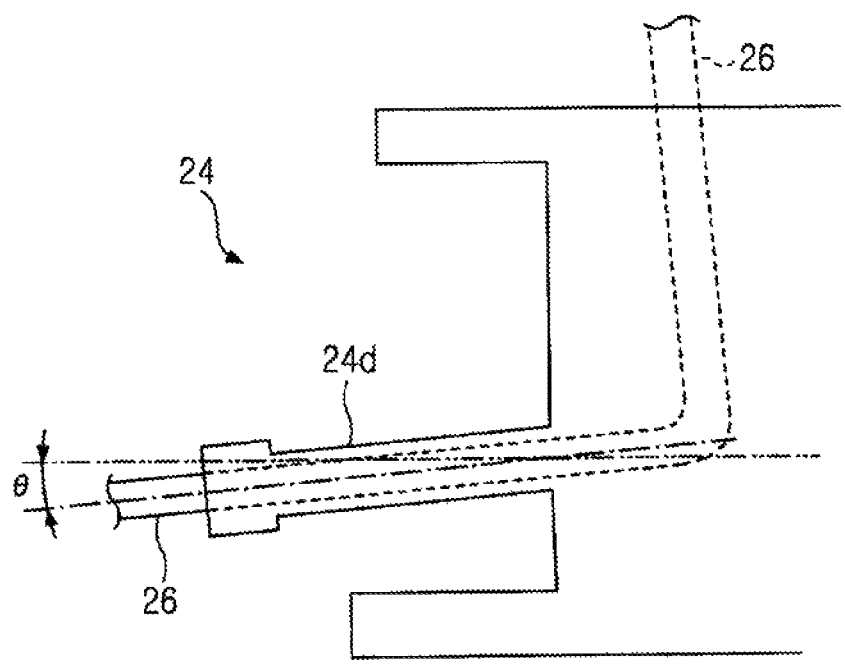

Meanwhile, FIG. 3B is a view showing the manifold 24, the protection pipe introduction portion 24d, and the protection pipe 26 when the outer chamber 23, the reaction chamber 22, and the wafer boat 21 are heated during, for example, the film formation. As shown in FIG. 3B, the protection pipe introduction portion 24d is tilted downward by an angle $\theta$ as the manifold 24 is deformed due to heat. According to actual measurement of the film forming apparatus 10 of the present embodiment, a temperature of the manifold 24 is about 195° C. and a tilt angle $\theta$ of the protection pipe introduction portion 24d is about 0.35° when the wafers W are heated up to 400° C. When the protection pipe introduction portion 24d is tilted, the protection pipe 26 is also tilted, and thus the protection pipe 26 is tilted toward the inner surface of the reaction chamber 22 in the space between the wafer boat 21 and the reaction chamber 22.

Here, if it is assumed that the protrusion portions 26a are not provided at the protection pipe 26, the protection pipe 26 tilted toward the reaction chamber 22 bends along the inner surface of the groove portion 22a (hereinafter, for convenience, referred to as the inner surface of the reaction chamber 22), and thus the outer surface of the protection pipe 26 contacts the inner surface of the reaction chamber 22 in a wide range. In this case, the outer surface of the protection pipe 26 may be relatively strongly adhered to the inner surface of the reaction chamber 22 due to a film deposited on the reaction chamber 22 or protection pipe 26, during the film formation. Here, when the heating of the wafers W using the heater 27 is stopped after the film formation, the temperature of the manifold 24 is also decreased. In addition, the protection pipe introduction portion 24d is returned to a horizontal direction (FIG. 3A). Then, a bending stress is applied to the protection pipe 26 having the outer surface adhered to the inner surface of the reaction chamber 22.

Next, a result of measuring a degree of a bending stress applied to the protection pipe 26 when the protection pipe introduction portion 24d has the tilt angle $\theta$ is described. In this measurement, instead of tilting the protection pipe introduction to portion 24d by heating the manifold 24, the protection pipe introduction portion 24d is tilted by tilting the manifold 24, thereby measuring a weight applied to the protection pipe 26 by using a push-pull gauge. The bending stress applied to the protection pipe 26 is obtained from the obtained weight, a bending amount of the protection pipe 26, and a shape of the protection pipe 26. Also, bending stresses were obtained when a length of an upright portion (a portion in the space between the wafer boat 21 and the reaction chamber 22) of the protection pipe 26 was about 1350 mm, at locations where heights from a horizontal portion (a portion supported by the protection pipe introduction portion 24d) of the protection pipe 26 were 150 mm, 300 mm, 450 mm, and 1330 mm.

Figure 4:
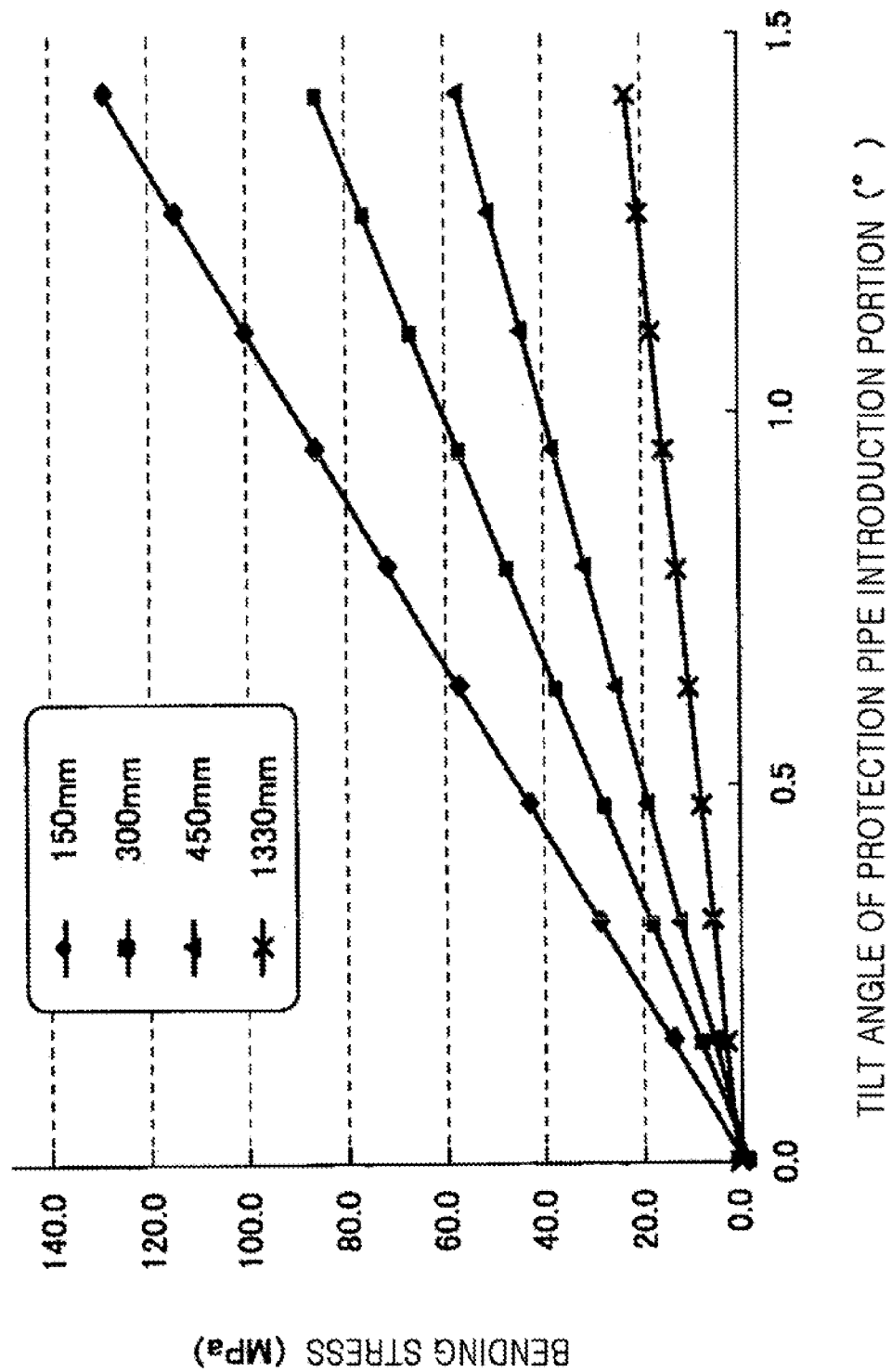
FIG. 4 is a graph showing a result of measuring a stress applied to the protection pipe in the film forming apparatus of FIG. 1.

The result of measuring the bending stresses is shown in FIG. 4. As shown in a graph of FIG. 4, a bending stress applied to the protection pipe 26 is increased in a straight line as the tilt angle θ of the protection pipe introduction portion 24d is increased. Also, a size of the bending stress is larger closer to a bottom of the upright portion of the protection pipe 26. In detail, the bending stress applied to the protection pipe 26 at the location 150 mm from the bottom of the upright portion of the protection pipe 26 is about 6 times larger than the bending stress applied to the protection pipe 26 at the location 1330 mm from the bottom.

As described above, if the outer surface of the protection pipe 26 is adhered to the inner surface of the reaction chamber 22, for example, around a center portion, during the film formation, a relatively large bending stress is applied to the protection pipe 26 in a direction away from the reaction chamber 22 as the manifold 24 returns back to an original shape during a temperature decrease. Then, the protection pipe may be damaged at a portion below the adhered portion.

However, in the present embodiment, since the protrusion portions 26a are provided at a top (leading end) portion of the protection pipe 26, even if the protection pipe 26 tilts towards the inner surface of the reaction chamber 22 due to thermal deformation of the manifold 24 during a temperature increase, only the protrusion portions 26a contact the inner surface of the reaction chamber 22, and thus the outer surface of the protection pipe 26 does not contact the inner surface of the reaction chamber 22. Accordingly, even if a film is formed on the outer surface of the protection pipe 26 or the inner surface of the reaction chamber 22, the outer surface of the protection pipe 26 may be prevented from being adhered to the inner surface of the reaction chamber 22.

Also, when the protrusion portions 26a are adhered to the inner surface of the reaction chamber 22 due to the film formation, the leading end portion of the protection pipe 26 is fixed to the inner surface of the reaction chamber 22 via the protrusion portions 26a, but since a stress applied to the leading end portion of the protection pipe 26 is relatively small as shown in FIG. 4, the protection pipe 26 may not be damaged. Also, even if the protrusion portions 26a are adhered to the inner surface of the reaction chamber 22, a contact area is smaller than when the outer surface of the protection pipe 26 is adhered to the inner surface of the reaction chamber 22, and thus the protrusion portions 26a are easily detached from the inner surface of the reaction chamber 22 during a temperature decrease. Accordingly, the leading end portion of the protection pipe 26 is to be a free end, and thus a bending stress is not applied to the protection pipe 26.

Here, a simulation of how the protection pipe 26 is bent when the protection pipe introduction portion 24d of the manifold 24 is tilted will now be described. FIG. 5A shows a model used in the simulation. The length of the upright portion of the protection pipe 26 was 1350 mm, and a thickness of the protection pipe 26 was about 12 mm. Also, an interval between the protection pipe 26 and the reaction chamber 22 was about 8 mm at a bottom end portion of the protection pipe 26, and about 4 mm at the leading end portion of the protection pipe 26. In other words, the upright portion of the protection pipe 26 was slightly tilted towards the inner surface of the reaction chamber 22. Also, when the protrusion portions 26a were provided, a location of the protrusion portions 26a was at about 20 mm from the leading end of the protection pipe 26. Also, a height of the protrusion portions 26a (a protruded amount from the outer surface of the protection pipe 26) was about 4 mm. In other words, the protrusion portions 26a contacted the inner surface of the reaction chamber 22 (that is, the leading end portion of the protection pipe 26 was about 4 mm away from the inner surface of the reaction chamber 22 due to the protrusion portions 26a).

Also, in this simulation, the tilt angle θ of the protection pipe introduction portion 24d of the manifold 24 was about 1.0°. A degree of tilt angle of the protection pipe 26 is schematically shown in FIG. 5A with a dotted line as if the reaction chamber 22 did not exist at this tilt angle θ.

Figure 5B:
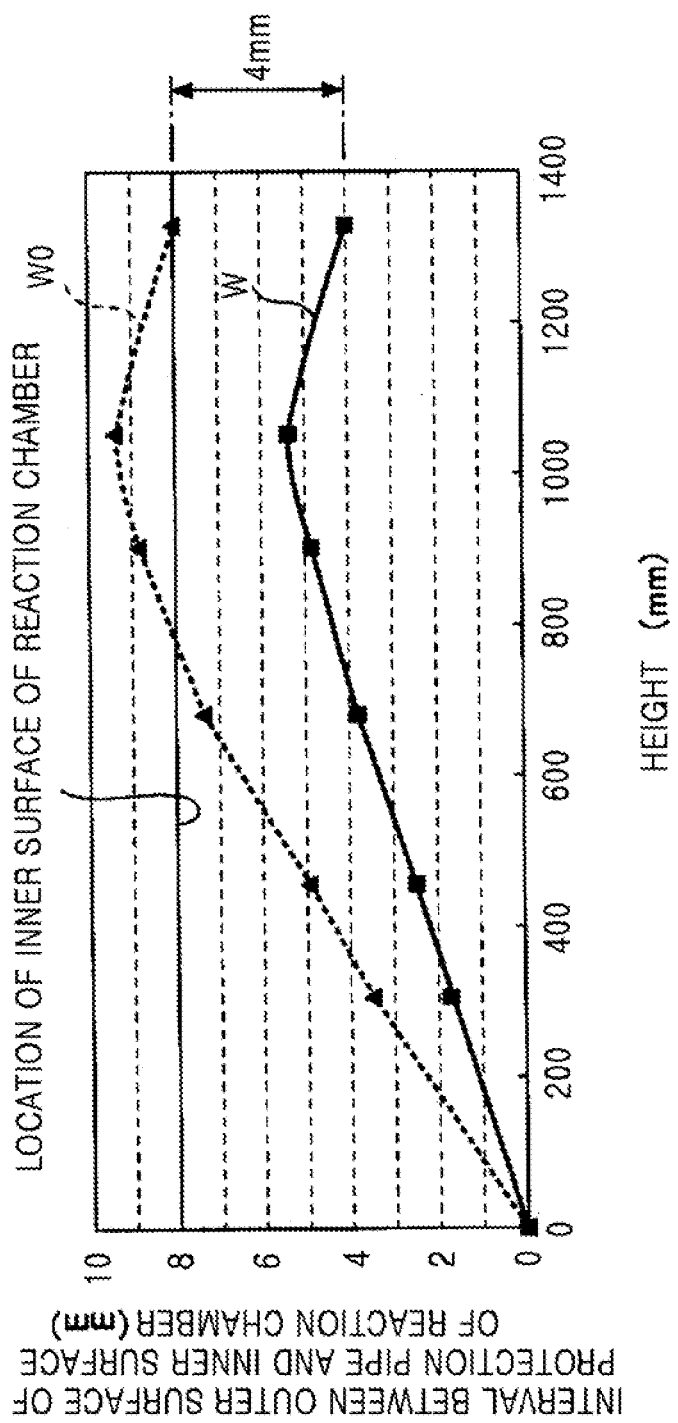

FIG. 5B shows a result of calculating how the protection pipe 26 is bent. As shown with a reference numeral W, a location of the leading end portion of the protection pipe 26 was fixed by the protrusion portions 26a, and the protection pipe 26 was bent between the leading end portion and the bottom end portion toward the inner surface of the reaction chamber 22. However, even at a location closest to the inner surface of the reaction chamber 22 (at a location where a height was about 1050 mm), there was an interval of about 2.5 mm between the outer surface of the protection pipe 26 and the inner surface of the reaction chamber 22. In other words, by providing the protrusion portions 26a having a height of about 4 mm at the leading end portion of the protection pipe 26, the outer surface of the protection pipe 26 may be prevented from contacting the inner surface of the reaction chamber 22.

Also, for comparison, an examination in which the protection pipe introduction portion 24d of the manifold 24 was tilted about 1.0° in the case that the leading end portion of the protection pipe 26 did not include the protrusion portions 26a and disposed to contact the inner surface of the reaction chamber 22, was done. As a result, as shown with a reference numeral WO of FIG. 5B, according to a calculation, the protection pipe 26 was bent and exceeded the location of the inner surface of the reaction chamber 22. In this case, since the protrusion portions 26a were not provided, the outer surface of the protection pipe 26 may contact the inner surface of the reaction chamber 22 throughout a range from a height of about 750 mm to the top. Accordingly, the outer surface of the protection pipe 26 may be adhered to the inner surface of the reaction chamber 22 in a wide range during the film formation. Moreover, if the outer surface of the protection pipe 26 is adhered to the inner surface of the reaction chamber 22 in the range from the height of about 750 mm to the top, the outer surface of the protection pipe 26 is relatively strongly adhered to the inner surface of the reaction chamber 22 while a relatively large bending stress is applied to the bottom of the protection pipe 26 (refer to FIG. 4), and thus it is highly likely that the protection pipe 26 is damaged.

Effects of providing the protrusion portions 26a to the protection pipe 26 are understood based on the above examinations.

While this invention has been particularly shown and described with reference to exemplary embodiments thereof, it will be understood by those skilled in the art that various changes in form and details may be made therein without departing from the spirit and scope of the invention as defined by the appended claims.

Figure 6A:
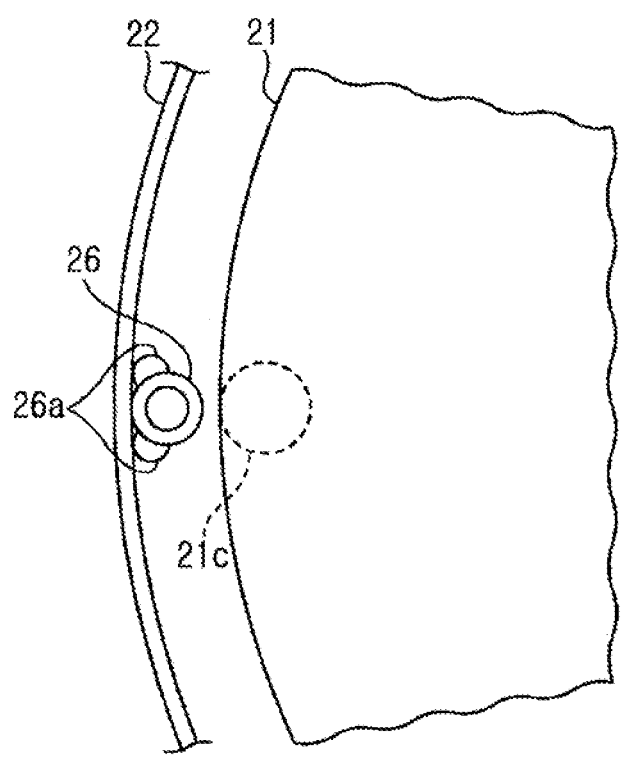
FIGS. 6A and 6B are schematic top views showing location relationships between the protection pipe and the reaction chamber in modified examples of the film forming apparatus of FIG. 1.

For example, the groove portion 22a is provided to be protruded outwardly along the protection pipe 26 on the reaction chamber 22 in the above embodiments, but the groove portion 22a is not necessarily required. For example, as shown in FIG. 6A of a top view corresponding to FIG. 2, the protection pipe 26 including the protrusion portions 26a may be disposed to the reaction chamber 22 not having a groove portion.

Also, only one protrusion portion 26a may be provided at the protection pipe 26. However, as described above, in the relationship with the groove portion 22a, it is preferable that two protrusion portions 26a are provided in order to prevent a location misalignment of the protection pipe 26 to a direction along the inner surface of the reaction chamber 22. Also, the angle interval between the two protrusion portions 26a is not limited to about 120°, and may be suitably determined as long as the outer surface of the protection pipe 26 does not contact the inner surface of the reaction chamber 22 (groove portion 22a).

Figure 6B:
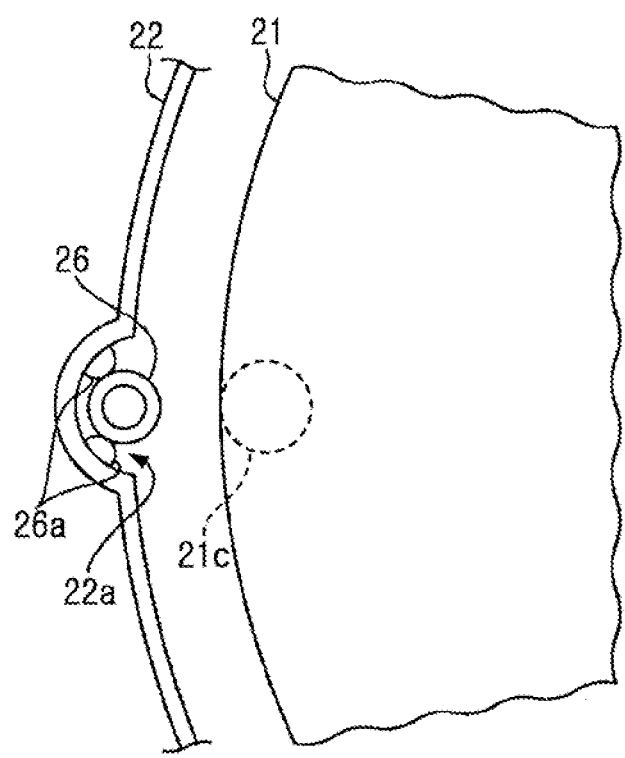

In addition, the protrusion portions 26a may be provided at the groove portion 22a of the reaction chamber 22 as shown in FIG. 6B, or at the inner surface of the reaction chamber 22 not having the groove portion 22a, instead of at the protection pipe 26. In this case, one protrusion portion 26a may be provided, or a plurality (preferably two) of protrusion portions 26a may be provided. Alternatively, the protrusion portions 26a may be provided at both the outer surface of the protection pipe 26 and the inner surface of the reaction chamber 22.

Also, in the above embodiments, the protrusion portions 26a provided at the leading end portion of the protection pipe 26 are disposed to contact the inner surface of the groove portion 22a of the reaction chamber 22, but the protection pipe 26 may be disposed such that the protrusion portions 26a do not contact the inner surface of the groove portion 22a at room temperature. In this case, the outer surface of the protection pipe 26 definitely does not contact the inner surface of the groove portion 22a during a temperature increase.

However, if the protrusion portions 26a are spaced apart from the inner surface of the groove portion 22a, the protection pipe 26 may vibrate in some cases, and thus the protrusion portions 26a may collide with the inner surface of the groove portion 22a, thereby generating a particle. Thus, to address the above matter, the protrusion portions 26a may contact the inner surface of the groove portion 22a.

Also, according to the location of the protection pipe introduction portion 24d in an up-and-down direction, the protection pipe 26 may be far from the inner surface of the reaction chamber 22. In this case, when the protection pipe 26 tilts towards the inner surface of the reaction chamber 22 due to the thermal deformation of the manifold 24, a distance between the thermocouple 26b and the wafer boat 21 in the protection pipe 26 is changed. When the distance is changed, the temperature of the wafers W held by the wafer boat 21 is changed, and thus reproducibility of a wafer temperature may be deteriorated. However, when the protection pipe 26 is disposed such that the protrusion portions 26a of the protection pipe 26 pre-contact the reaction chamber 22 (or the groove portion 22a), the change of the interval between the protection pipe 26 and the wafer boat 21 may be reduced. Accordingly, junction/disjunction of the protrusion portions 26a to the reaction chamber 22 (or the groove portion 22a) may be determined according to circumstances.

Also, the location of the protrusion portions 26a is not limited to the leading end portion of the protection pipe 26, and may be a center portion (a center portion of the inner surface of the reaction chamber 22) because the outer surface of the protection pipe 26 can be prevented from directly contacting the inner surface of the reaction chamber 22 by using the protrusion portions 26a provided at the center portion. Accordingly, the outer surface of the protection pipe 26 is prevented from being adhered to the inner surface of the reaction chamber 22. Also, even if the protrusion portions 26a provided at the center portion is adhered to the inner surface of the reaction chamber 22, the protrusion portions 26a are easily detached from the inner surface of the reaction chamber 22 since a contact area between the protrusion portions 26a and the inner surface of the reaction chamber 22 is small. According to experiments of the present inventors, the outer surface of the protection pipe 26 is not strongly adhered to the inner surface of the reaction chamber 22 via the protrusion portions 26a even when the protrusion portions 26a are provided at a location about 700 mm to about 800 mm from a bottom of the protection pipe 26.

Also, in the above embodiments, the reaction chamber 22 is provided on an inner side of the outer chamber 23, and the wafer boat 21, the raw material gas nozzle 25, and the protection pipe 26 are disposed on an inner side of the reaction chamber 22. Thus, a thin film may not be formed on the inner surface of the outer chamber 23. Meanwhile, a thin film is formed on the inner surface of the reaction chamber 22, but since the reaction chamber 22 is smaller than the outer chamber 23, cleaning for removing the thin film formed on the inner surface may be easily performed. Also, preparing and suitably exchanging a plurality of reaction chambers 22 costs less than preparing and suitably exchanging a plurality of outer chambers 23.

Also, instead of using the reaction chamber 22, the protection pipe 26 may be disposed to extend along the inner surface of the outer chamber 23. In other words, the outer chamber 23 may be used as a reaction chamber. In this case, effects and advantages of the above embodiments are clearly exhibited.

Also, a plurality of protection pipes 26 having different lengths (heights) may be provided, and one thermocouple may be inserted therein respectively. In this case, the protrusion portions 26a may be provided for each protection pipe 26.

Also, in the film forming apparatus 10, a thin film formed on the wafers W is not limited to an amorphous silicon film, and for example, may be a silicon oxide film, a silicon nitride film or the like.

Also, a depth (sunken amount) or a width of the groove portion 22a provided on the reaction chamber 22 may be suitably determined according to the outer diameter of the protection pipe 26 used. Also, a sunken shape is not limited to a circular cross-section (top shape), and may have a rectangular cross-section. When the groove portion 22a has a rectangular cross-section, three protrusion portions 26a may be provided on the protection pipe 26 according to each surface of the groove portion 22a having the rectangular cross-section.

The length and diameter of the protection pipe 26, the size of the protrusion portions 26a, etc. described above are only examples, and may be suitably determined in each of film forming apparatuses according to a size of the wafers W on which a thin film is formed or a number of wafers W per one film forming process.

According to the embodiments of the present invention, a film forming apparatus capable of preventing an outer surface of a protection pipe from being adhered to an inner surface of a reaction chamber is provided. According to the above structure, since one end portion of the protection pipe is fixed to a support unit supporting the reaction chamber, when the support unit is thermally deformed by heat from a heating unit, the protection pipe may tilt towards the inner surface of the reaction chamber. However, even in this case, the outer surface of the protection pipe is prevented from contacting the inner surface of the reaction chamber by a protrusion portion. Accordingly, even when a film is formed on the outer surface of the protection pipe and the inner surface of the reaction chamber by a raw material gas supplied from a raw material gas supply pipe, the outer surface of the protection pipe is prevented from being adhered to the inner surface of the reaction chamber. Thus, an operation of separating the protection pipe from the inner surface of the reaction chamber is not required during maintenance. Also, a large stress is not applied to the protection pipe if the outer surface of the protection pipe is not adhered to the inner surface of the reaction chamber, and thus the protection pipe may not be damaged.

What is claimed is:

1. A film forming apparatus comprising:
    a substrate holding unit which holds a plurality of substrates such that the plurality of substrates are stacked on each other at intervals;
    a reaction chamber which accommodates the substrate holding unit;
    a raw material gas supply pipe which supplies a raw material gas of a thin film formed on the plurality of substrates to the plurality of substrates held by the substrate holding unit accommodated in the reaction chamber;
    a support unit which supports the reaction chamber;
    a heating unit which is disposed outside the reaction chamber and heats the plurality of substrates;
    a protection pipe which includes one end portion fixed to the support unit, is extended along an arrangement direction of the plurality of substrates between the substrate holding unit and the reaction chamber, and includes a temperature measuring unit inserted therein, wherein when the support unit is thermally deformed by heat from the heating unit, the protection pipe tilts toward an inner surface of the reaction chamber; and
    a protrusion portion which is provided on at least one of an outer surface of the protection pipe and the inner surface of the reaction chamber, and provides a gap between the outer surface of the protection pipe and the inner surface of the reaction chamber, wherein when the protection pipe tilts toward the inner surface of the reaction chamber, the outer surface of the protection pipe is prevented from contacting the inner surface of the reaction chamber by the protrusion portion.

2. The film forming apparatus of claim 1, wherein the protrusion portion is provided at the outer surface of the other end portion of the protection pipe opposite to the one end portion of the protection pipe fixed to the support unit.

3. The film forming apparatus of claim 1, wherein the reaction chamber has a groove portion sunken along the protection pipe, and the protrusion portion prevents the outer surface of the protection pipe and an inner surface of the groove portion of the reaction chamber from contacting each other.

4. The film forming apparatus of claim 1, wherein an additional protrusion portion is provided at a predetermined interval from the protrusion portion.

5. The film forming apparatus of claim 4, wherein the protrusion portion and the additional protrusion portion are provided at predetermined intervals in a horizontal direction at the other end portion of the protection pipe opposite to the one end portion of the protection pipe fixed to the support unit.

6. The film forming apparatus of claim 1, further comprising an outer chamber which is capable of accommodating the reaction chamber and is supported by the support unit.

* * * * *